United States Patent [19]

Tsuchiya et al.

[11] Patent Number: 5,536,603
[45] Date of Patent: Jul. 16, 1996

[54] PHASE SHIFT MASK AND METHOD OF FABRICATING THE SAME

[75] Inventors: Takashi Tsuchiya, Urawa; Masami Watase, Kawasaki, both of Japan; Katsuya Okumura, Poughkeepsie; Toru Watanabe, Hopewell Junction, both of N.Y.

[73] Assignee: Kabushiki Kaisha Toshiba, Kawasaki, Japan

[21] Appl. No.: 359,547

[22] Filed: Dec. 20, 1994

[30] Foreign Application Priority Data

Dec. 21, 1993 [JP] Japan ................................. 5-320719
Nov. 22, 1994 [JP] Japan ................................. 6-288267

[51] Int. Cl.⁶ ............................................... G03F 9/00
[52] U.S. Cl. .................. 430/5; 430/323; 430/324; 216/12; 216/48; 216/47
[58] Field of Search .................. 430/5, 323, 324; 156/643, 646, 653

[56] References Cited

U.S. PATENT DOCUMENTS 4,954,218  9/1990  Okumura et al. ................. 156/643
5,114,760  5/1992  Takemura et al. ................. 427/430.1
5,380,609  1/1995  Fujita et al. ................................. 430/5

OTHER PUBLICATIONS

Nakagawa et al., "Phase Shift Exposure Development of Shifter Light-Shielding Method Prioritizing Easiness of Use", *Nikkei Microdevices*, May 1991, pp. 53–58.

"Investigation of SOG, Sputtering, and CVD", *Nikkei Microdevices*, May 1991, p. 64.

*Primary Examiner*—S. Rosasco
*Attorney, Agent, or Firm*—Finnegan, Henderson, Farabow, Garrett & Dunner

[57] ABSTRACT

A photoresist pattern is formed on a quartz substrate. The quartz substrate is dipped into a silicon oxide supersaturated solution of hydrofluoric acid, and a silicon oxide is precipitated out of the supersaturated solution, thereby forming an $SiO_2$ film on that exposed surface of the quartz substrate which is not covered with the photoresist pattern. After that, the photoresist pattern is ashed by oxygen plasma, and the ashed pattern is removed. The $SiO_2$ film remaining on the quartz substrate serves as a phase shifter.

33 Claims, 10 Drawing Sheets

PHASE SHIFT MASK AND METHOD OF FABRICATING THE SAME

BACKGROUND OF THE INVENTION

1. Field of the Invention

The present invention relates to a phase shift mask used in the photolithography process for manufacturing a semiconductor integrated circuit device, and a method of fabricating the phase shift mask.

2. Description of the Related Art

Conventionally, in a mask used in the photolithography process which is one of the major processes of manufacturing a semiconductor integrated circuit device, a desired pattern is formed of light-shielding materials, such as chromium and tungsten, on a light transmitting substrate of quartz or the like. The intensity of light transmitted through this type of mask does not change suddenly because of scattering or interference of the light at the edges of the pattern, which causes a drawback of preventing a very small pattern from being resolved.

To eliminate the above drawback, an attempt to improve the resolution of a pattern has been made by reducing the light interference effect by shifting a phase of part of the transmitted light. This attempt is called a phase shift method, and a mask formed by the method is called a phase shift mask. The phase shift method includes various types of methods, such as the Levenson method, auxiliary pattern method, edge emphasis method, multistage method, chrome-less method, and shifter light-shielding method. The phase shift mask is provided with a phase shifter as component for shifting the phase of light for exposure. For example, photoresist can be used to form a phase shifter, or a projection of that uneven surface of a glass substrate which is obtained by etching can be used as a phase shifter. This type of phase shifter is described in Nakagawa et al., *Nikkei Microdevices,* "Phase Shift Exposure Development of Shifter Light-Shielding Method Prioritizing Easiness of Use," May, 1991, pp. 53–58.

The mask having a phase shifter formed of photoresist has the advantage of allowing the phase shifter to be self-aligned with a chrome film (light-shielding film pattern), and can be formed relatively easily, finely, precisely. Since, however, the photoresist of the phase shifter is an organic film, the finished mask cannot resist good (or strong) washing, e.g., washing using acid, and has the disadvantage of easily causing a flaw in the surface of the mask.

In contrast, the mask having a phase shifter formed by etching a glass substrate is able to overcome the above disadvantage of the phase shifter formed of photoresist. Since, however, there are no members for stopping the etching of the glass substrate, the etching varies in depth, thus making it difficult to form the phase shifter.

A method of fabricating a phase shifter by SOG (Spin on Glass) has recently been proposed and brought into the public eye. This method is described in *Nikkei Microdevices,* "Investigation of SOG, Sputtering and CVD," 1991, May, p. 64.

Organic matter having a methyl group is used for the SOG since it is increased in fluidity and easily applied to a substrate, a film, and the like. Since, however, the organic matter causes damage to the transparence (transmittance) of a film, light is attenuated when penetrating the phase shifter. Since the organic matter is evaporated when the phase shifter is baked, the phase shifter is decreased in volume and thus difficult to form according to the specifications. Furthermore, since the glass substrate is rotated in fabricating the phase shifter, SOG is caused to flow on, e.g., a chrome film (light-shielding film pattern) by the centrifugal force, the SOG is formed thick in the recess portion and as is formed thin in the projection surface. It is thus difficult to uniform the thickness of the SOG and to determine the size of the phase shifter.

SUMMARY OF THE INVENTION

A first object of the present invention is to provide a phase shift mask having a minute, precise phase shifter which does not damage the transmittance.

A second object of the present invention is to provide a high-resolution phase shift mask which can be improved in the contrast of light intensity.

A third object of the present invention is to provide a method of easily fabricating a phase shift mask having a minute, precise phase shifter which does not damage the transmittance.

A fourth object of the present invention is to provide a method of fabricating a phase shift mask which has a high-resolution phase shifter and can be improved in the contrast of light intensity.

The first and second objects can be attained by a phase shift mask comprising a transmitting substrate and a phase shifter constituted by an LPD film formed on the transmitting substrate.

The third and fourth objects can be attained by a method of fabricating a phase shift mask comprising the steps of forming a photoresist pattern on a transmitting substrate and forming a phase shifter on an exposed surface of the transmitting substrate by the liquid phase deposition.

According to the phase shift mask having the above constitution, since the phase shifter need not be improved in flexibility, the transmittance can be prevented from lowering, and the attenuation of light applied to the phase shifter can be decreased. Consequently, the phase shift mask is improved in contrast of light intensity and increased in resolution.

According to the method described above, since nothing has to be added to the phase shifter, the transmittance of the phase shifter is not degraded, or the volume thereof is not reduced. Furthermore, since the phase shifter can be uniformly formed on the transmitting substrate, the precision of the phase shifter can be enhanced. Since the liquid phase deposition is employed and part of the transmitting substrate is formed by water repellency finishing, the phase shifter can be prevented from growing on the water-repellent part, thus allowing selective growth of the phase shifter.

DETAILED DESCRIPTION OF THE PREFERRED EMBODIMENTS

Figure 1A:
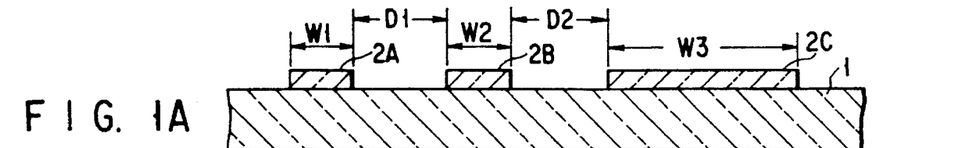
FIG. 1A is a cross-sectional view of a chromeless phase shift mask, for explaining a phase shift mask according to a first embodiment of the present invention.
Figure 1B:
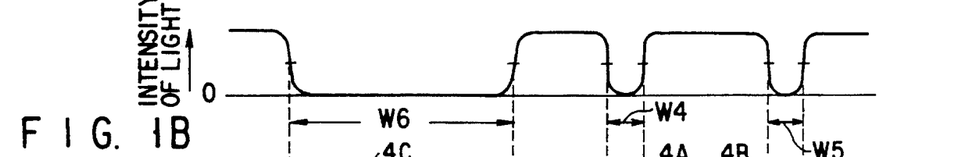
FIG. 1B is a diagram of the light intensity of the phase shift mask shown in FIG. 1A.
Figure 1C:
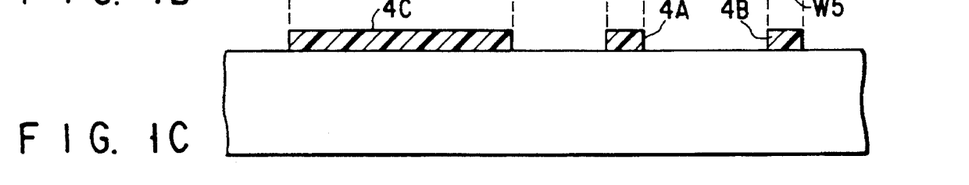
FIG. 1C is a cross-sectional view of resist patterns formed by using the phase shift mask shown in FIG. 1A.

FIGS. 1A to 1C are views for explaining a phase shift mask according to a first embodiment of the present invention. FIG. 1A is a cross-sectional view of a chromeless phase shift mask in which a pattern is formed by only a phase shifter, FIG. 1B is a diagram showing the light intensity of the phase shift mask of FIG. 1A, and FIG. 1C is a cross-sectional view of resist patterns formed by using the phase shift mask shown in FIG. 1A.

As illustrated in FIG. 1A, phase shifters 2A, 2B and 2C are provided on a transmitting substrate 1 of quartz or the like, and each constituted by an $SiO_2$ film formed by the LPD (Liquid Phase Deposition) using the substrate 1 as a seed crystal.

Hereinafter the $SiO_2$ film formed by the LPD is called an LPD film (or SORD film) in order to discriminate it from an $SiO_2$ film formed by another fabrication method. In general, a four X phase shift mask or a five X phase shift mask is provided to reduce the size of a pattern to ¼ or ⅕ in accordance with an optical system and project the reduced pattern on a photoresist layer. In the following description, the dimensions of a phase shifter of the quintuple phase shift mask are given, whereas those of a resist pattern formed by the quintuple shift mask are given on the assumption that the pattern is formed on a wafer.

In the phase shift mask shown in FIG. 1A, when an i-line (wavelength: 365 nm) is used for exposure, the widths W1 and W2 of the phase shifters 2A and 2B are each set to be 0.5 to 2.0 µm, the width W3 of the phase shifter 2C is set to be 1.0 µm or more, and the interval D1 between the phase shifters 2A and 2B is set to be 0.5 to 2.0 µm, favorably 0.8 µm or less. The interval D2 between the phase shifters 2B and 2C need not be particularly determined since it separates the phase shifters 2A and 2B from the phase shifter 2C. If a KrF excimer laser (wavelength: 248 nm) is used, the widths W1 and W2 are each set to be 0.2 to 1.5 µm, the width W3 is set to be 1.0 µm or more, and the intervals D1 and D2 are each set to be 1.0 to 1.5 µm.

In the chromeless phase shift mask, as shown in FIG. 1B, the light intensity is lowered at the edges of the phase shifter 2C which is broader than the other phase shifters. Therefore, as shown in FIG. 1C, narrow resist (photoresist) patterns 4A and 4B can be formed, and their widths W4 and W5, which are the same, are each 0.2 to 0.3 µm when the i-line is used and 0.1 to 0.2 µm when the KrF excimer laser is used. On the other hand, since the light intensity continues to be low in a large area where the narrower phase shifters 2A and 2B are continuously formed, a broad resist pattern 4C can be formed, and its width W6 is 0.5 to 1.2 µm when the i-line is used and 0.3 to 1.0 µm when the KrF excimer laser is used.

The above dimensions are favorable for the phase shifters 2A to 2B and resist patterns 4A to 4C. It is however needless to say that a larger pattern can be formed, and both a very small pattern and a large pattern can be formed together by a single phase shift mask.

Figure 2A:
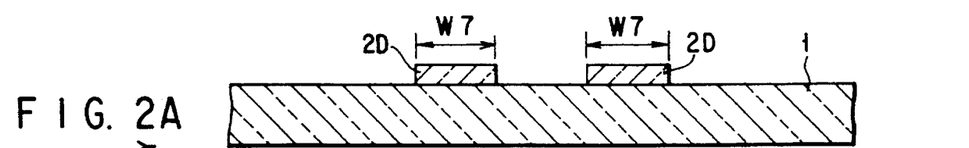
FIG. 2A is a cross-sectional view of a halftone phase shift mask, for explaining a phase shift mask according to a second embodiment of the present invention.
Figure 2B:
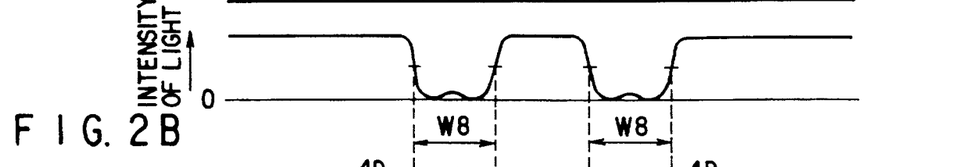
FIG. 2B is a diagram of the light intensity of the phase shift mask shown in FIG. 2A.
Figure 2C:
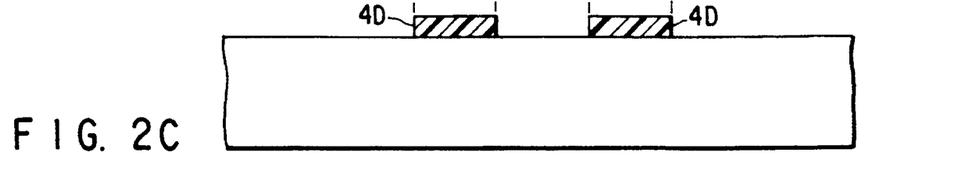
FIG. 2C is a cross-sectional view of resist patterns formed by using the phase shift mask shown in FIG. 2A.

FIGS. 2A to 2C are views for explaining a phase shift mask according to a second embodiment of the present invention. FIG. 2A shows another example where a pattern is formed by only a phase shifter, that is, a cross-sectional view of a halftone phase shift mask, FIG. 2B is a diagram of the light intensity of the phase shift mask shown in FIG. 2A, and FIG. 2C is a cross-sectional view of resist patterns formed by using the phase shift mask shown in FIG. 2A.

As illustrated in FIG. 2A, a phase shifter 2D constituted by an LPD film, is provided on a transmitting substrate 1 of quartz or the like. The phase shifter 2D contains pigment (e.g., Cathilon Yellow) to control the transmittance of light for exposure. For example, when the thickness of the phase shifter 2D is about 2000Å, the transmittance of light (i-line: wavelength= 365 nm) for exposure is set to be about 9%.

It is desirable to set the width W7 of the phase shifter 2D shown in FIG. 2A to 2.0 to 4.0 μm when the i-line is used for exposure, while it is desirable to set the width W7 to 1.0 to 3.0 μm when the KrF excimer laser is used.

In the halftone phase shift mask, since the contrast is increased at the edges of the phase shifter 2D and the transmittance of each phase shifter 2D itself is controlled, the light intensity is much lowered in an area under the phase shifters 2D, resulting in the light intensity as shown in FIG. 2B. If, therefore, the width W7 of each of the phase shifters 2D is optimized, resist patterns 4D having sharp edges can be formed under the edges of the phase shifter 2D, as shown in FIG. 2C. The width W8 of each of the resist patterns 4D ranges from approximately 0.3 to 0.5 μm when the i-line is used and from approximately 0.1 to 0.3 μm when the KrF excimer laser is used.

Figure 3A:
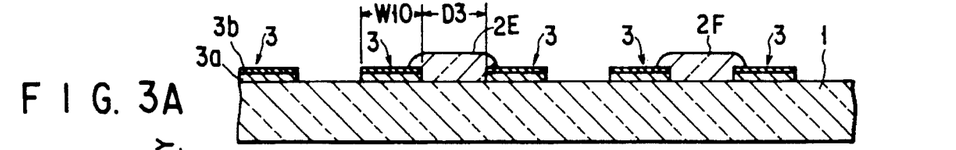
FIG. 3A is a cross-sectional view of a Levenson phase shift mask, for explaining a phase shift mask according to a third embodiment of the present invention.
Figure 3B:
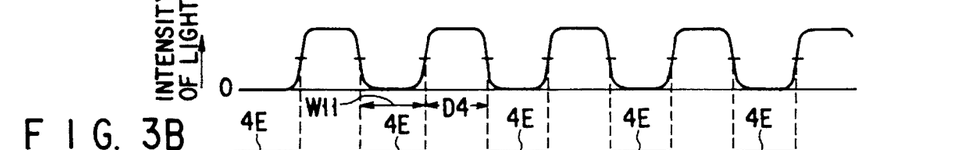
FIG. 3B is a diagram of the light intensity of the phase shift mask shown in FIG. 3A.
Figure 3C:
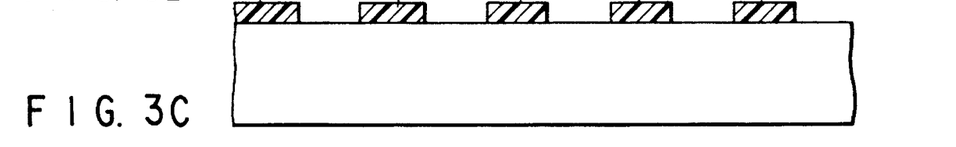
FIG. 3C is a cross-sectional view of resist patterns formed by using the phase shift mask shown in FIG. 3A.

FIGS. 3A to 3C are views for explaining a phase shift mask according to a third embodiment of the present invention. FIG. 3A is a cross-sectional view of a Levenson phase shift mask in which a resist pattern is obtained by combination of light-shielding film patterns and phase shifters, FIG. 3B is a diagram of the light intensity of the phase shift mask shown in FIG. 3A, and FIG. 3C is a cross-sectional view of resist patterns formed by using the phase shift mask shown in FIG. 3A.

As shown in FIG. 3A, shielding film patterns 3 are formed on a transmitting substrate 1 of quartz or the like, and each have a laminated structure wherein a chrome oxide film 3b is formed on the surface of a chrome layer 3a as an antireflection film. Phase shifters 2E and 2F each constituted by an LPD film, are provided alternately between adjacent light-shielding film patterns on the exposed surface of the substrate 1.

When the i-line is used for exposure, the width W10 of each light-shielding film pattern 3 shown in FIG. 3A is set to 1.0 to 5.0 μm, and the interval D3 between adjacent patterns 3 is set to 1.0 to 5.0 μm. When the KrF excimer laser is used, the width W10 is set to 0.5 to 3.0 μm and the interval D3 is set to 0.5 to 3.0 μm.

In the Levenson phase shift mask, a plurality of regions where the light intensity is lowered are obtained, as shown in FIG. 3B. It is thus effective to form repetitive resist patterns 4E in line, as shown in FIG. 3C. The width W11 of each resist pattern 4E ranges from 0.2 to 1.0 μm, and the interval D4 between adjacent patterns 4E ranges from 0.1 to 0.6 μm.

Figure 4A:
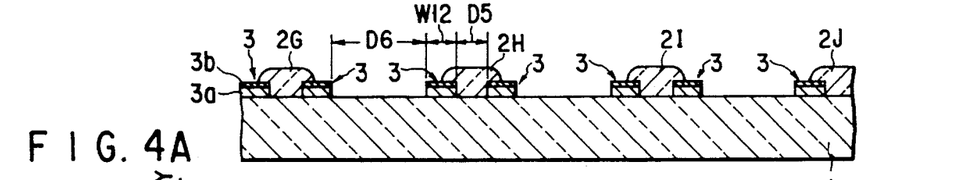
FIG. 4A is a cross-sectional view of a light-shielding effect emphasis phase shift mask, for explaining a phase shift mask according to a fourth embodiment of the present invention.
Figure 4B:
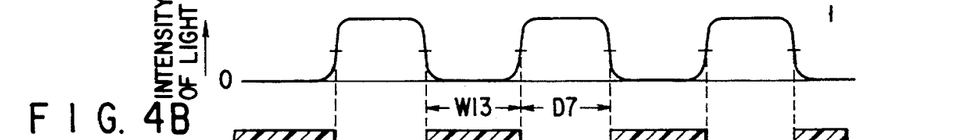
FIG. 4B is a diagram of the light intensity of the phase shift mask shown in FIG. 4A.
Figure 4C:
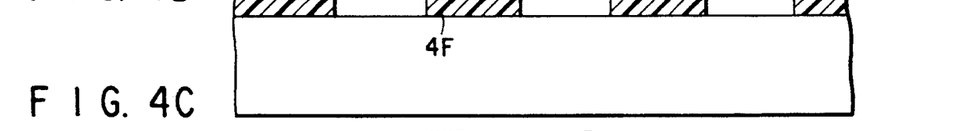
FIG. 4C is a cross-sectional view of resist patterns formed by using the phase shift mask shown in FIG. 4A.

FIGS. 4A to 4C are views for explaining a phase shift mask according to a fourth embodiment of the present invention. FIG. 4A shows another example where a pattern is formed by combination of light-shielding film patterns and phase shifters, that is, a cross-sectional view of a cross-sectional view of a light-shielding effect emphasis phase shift mask, FIG. 4B is a diagram of the light intensity of the phase shift mask shown in FIG. 4A, and FIG. 4C is a cross-sectional view of resist patterns formed by using the phase shift mask shown in FIG. 4A.

As illustrated in FIG. 4A, light-shielding film patterns 3 are formed on a transmitting substrate 1 of quartz or the like, and each have a laminated structure wherein a chrome oxide film 3b is formed on the surface of a chrome layer 3a as an antireflection film. The width W12 of each light-shielding film pattern 3, which is smaller than that of the light-shielding film pattern of the Levenson phase shift mask described above, ranges from 1.0 to 3.0 μm when the i-line is used for exposure and from 0.5 to 2.0 μm when the KrF is used. Furthermore, as shown in FIG. 4A, the narrow and broad intervals D5 and D6 between adjacent light-shielding film patterns are alternated with each other. The narrow interval D5 is set to be 1.0 to 3.0 μm when the i-line is used and 0.4 to 1.5 μm when the KrF is used. The broad interval D6 is set to be 1.0 μm or more when the i-line is used and 0.5 μm or more when the KrF is used. Phase shifters 2G, 2H, 2I, and 2J each constituted by an LPD film, are provided in their respective narrow intervals D5 on the substrate 1.

The light intensity of the light-shielding effect emphasis phase shift mask is shown in FIG. 4B. As illustrated in FIG. 4C, resist patterns 4F having a width W13 are formed. The width W13 ranges from 0.2 to 0.6 μm when the i-line is used and from 0.1 to 0.3 μm when the KrF is used. The interval D7 between adjacent resist patterns 4F ranges from 0.2 to 0.6 μm when the i-line is used, and from 0.1 to 0.3 μm when the KrF is used.

Figure 5A:
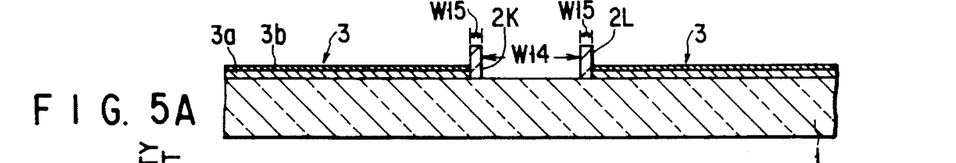
FIG. 5A is a cross-sectional view of an edge emphasis phase shift mask, for explaining a phase shift mask according to a fifth embodiment of the present invention.
Figure 5B:
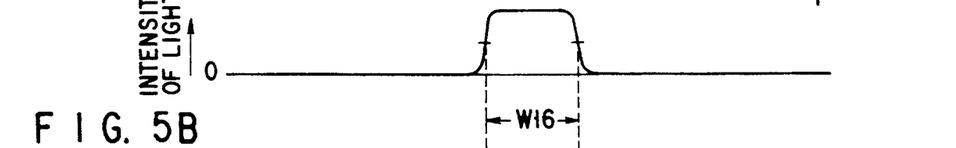
FIG. 5B is a diagram of the light intensity of the phase shift mask shown in FIG. 5A.
Figure 5C:
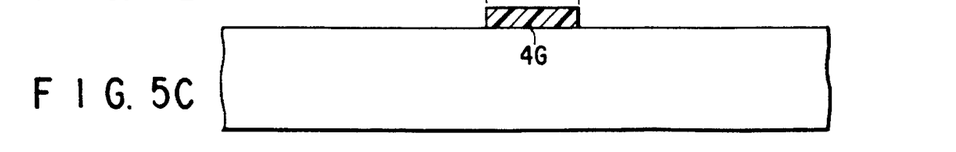
FIG. 5C is a cross-sectional view of a resist pattern formed by using the phase shift mask shown in FIG. 5A.

FIGS. 5A to 5C are views for explaining a phase shift mask according to a fifth embodiment of the present invention. FIG. 5A shows still another example where a pattern is formed by combination of light-shielding film patterns and phase shifters, that is, a cross-sectional view of an edge emphasis phase shift mask, FIG. 5B is a diagram of the light intensity of the phase shift mask shown in FIG. 5A, and FIG. 5C is a cross-sectional view of a resist pattern formed by using the phase shift mask shown in FIG. 5A.

As illustrated in FIG. 5A, light-shielding film patterns 3 are formed on a transmitting substrate 1 of quartz or the like, and each have a laminated structure wherein a chrome oxide film 3b is formed on the surface of a chrome layer 3a as an antireflection film. Phase shifters 2K and 2L each constituted by an LPD film, are provided on the side walls of an opening formed between the light-shielding film patterns 3. The width W14 of the opening is set to 1.5 μm or more when the i-line is used and 1.0 μm or more when the KrF excimer laser is used. The width W15 of each of the phase shifters 2K and 2L is set to 0.2 to 1.0 μm when the i-line is used and 0.1 to 0.5 μm when the KrF excimer laser is used.

The light intensity of the edge emphasis phase shift mask is shown in FIG. 5B, and a resist pattern 4G having a width W16 is obtained as shown in FIG. 5C. The width W16 is 0.2 μm or more when the i-line is used, and 0.1 μm or more when the KrF excimer laser is used.

Figure 6A:
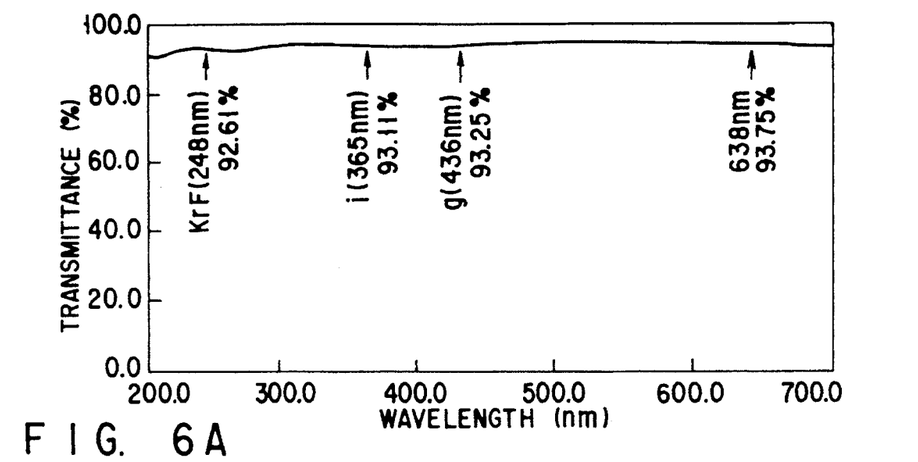
FIG. 6A is a graph for explaining a relationship between the wavelength and transmittance of light applied to an LPD (Liquid Phase Deposition) film.
Figure 6B:
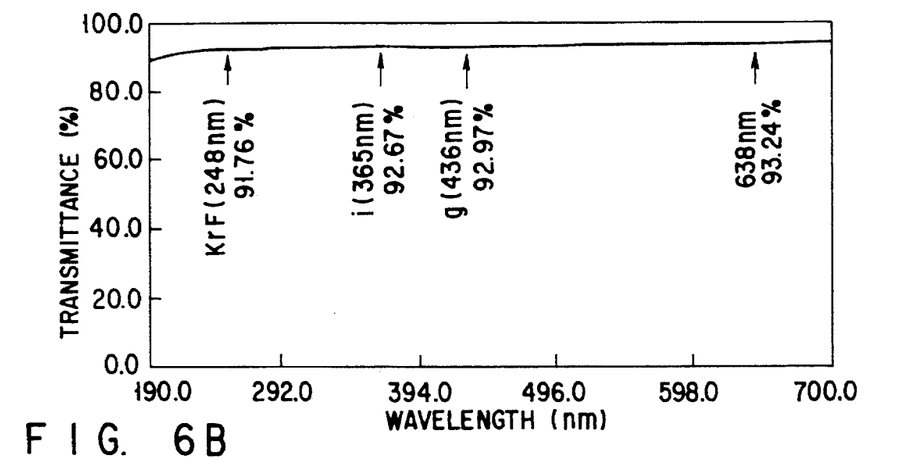
FIG. 6B is a graph for explaining a relationship between the wavelength and transmittance of light applied to a quartz substrate.

FIGS. 6A and 6B are graphs for explaining a relationship between the wavelength and transmittance of light. FIG. 6A shows the relationship between them in the LPD film ($SiO_2$ film formed by the LPD), while FIG. 6B does it in the quartz substrate.

As shown in FIG. 6A, the transmittance of light applied to the LPD film is always kept to 90% or more when the wavelength of the light ranges from 200 to 700 nm. As shown in FIG. 6B, it is confirmed that the transmittance of light applied to the LPD film is higher than that of light applied to the quartz substrate within the range from 200 to 700 nm. The light transmittance of the LPD film is therefore satisfactory and, even if a phase shifter is formed by the LPD film, the transmittance of the mask itself does not decrease. In particular, the transmittance of the i-line (wavelength: 365 nm) applied to the LPD film and that of the KrF excimer laser (wavelength: 248 nm) applied thereto are 93.11% and 92.61%, respectively. It can be judged from the characteristics of the i-line and KrF excimer laser that a considerable transmittance can be obtained even from an ArF excimer laser having a wavelength of 193 nm and the ArF excimer laser is therefore very effective.

Referring to a DRAM as an example of a semiconductor integrated circuit device, the i-line is used to form a pattern in manufacture of a 64-Mbit DRAM, the KrF excimer laser is used for a 256-Mbit DRAM, and the ArF excimer laser is used for a 1-Gbit DRAM. Consequently, the phase shift mask of the present invention can be applied to the DRAMs of 64 Mbits to 1 Gbits.

Figure 7:
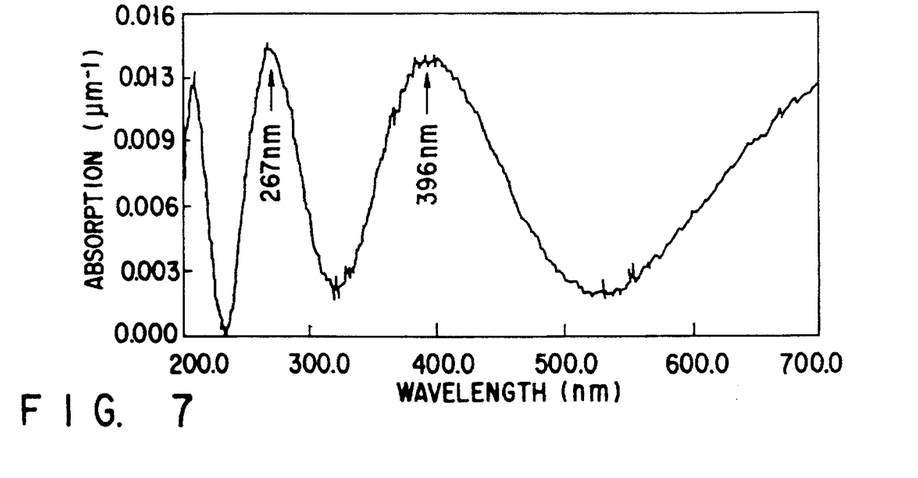
FIG. 7 is a graph showing a relationship between the wavelength and absorption of light applied to the LPD film.

FIG. 7 is a graph showing a relationship between the wavelength and absorption of light applied to the LPD film. As is apparent from FIG. 7, there are the absorption peaks of the light in the vicinities of the wavelengths of 396 nm and 267 nm. Since the light of 396 nm and that of 267 were pre-resonant with the i-line of 365 nm and the KrF excimer laser of 248 nm, respectively, an adverse influence such as fluorescence and resolution was expected. To confirm this influence, the inventors of the present invention carried out a damage test by irradiating the LPD film with the KrF excimer laser.

Figure 8:
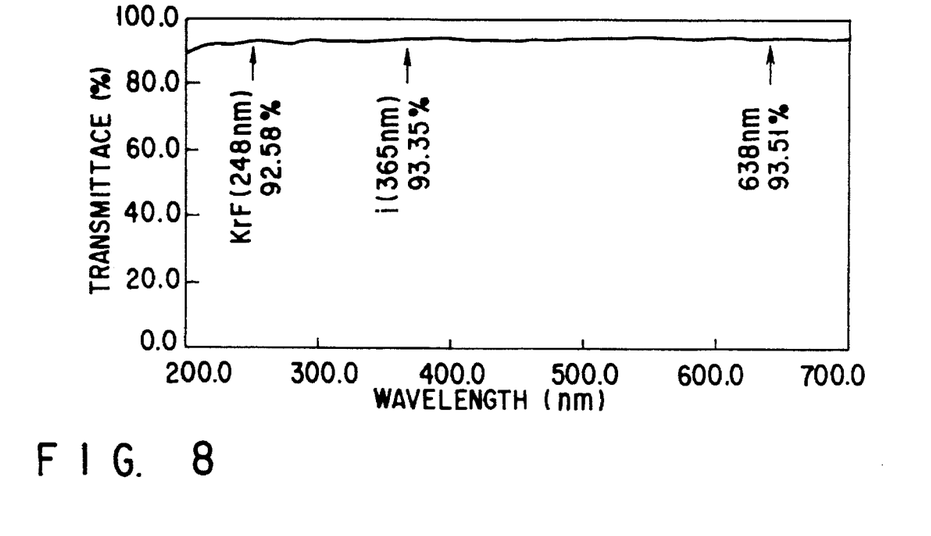
FIG. 8 is a graph showing a relationship between the wavelength and transmittance of light after a damage test using a laser beam.

FIG. 8 is a graph showing a relationship between the wavelength and transmittance of light after the damage test. This damage test was based on the premise that a KrF excimer laser (TELS-1 of Cymer Co., Ltd) was used as an optical source, and a resist (XP8843 of Tokyo Ohka Kogyo Co., Ltd) was used in the 64-Mbit DRAM. The exposure energy was 1.2 J as an output of the laser, and the number of shots was 4800.

As is indicated in FIG. 8, the transmittance of the KrF excimer laser of 248 nm emitted to the LPD film after the damage test, is 92.58%, and the LPD film is not damaged by the emission of the KrF excimer laser more remarkably than in the case of FIG. 6A. It was therefore confirmed that the LPD film was hardly damaged by emission of the KrF excimer laser, and the fluorescence or resolution due to the pre-resonance described above was hardly likely to occur.

A method of fabricating a phase shift mask according to each of the above embodiments, will now be described in detail.

Figure 9A:
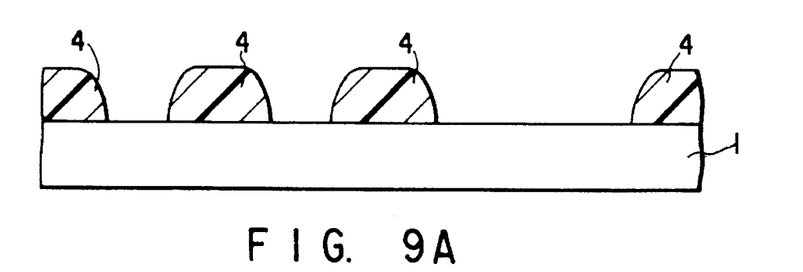
FIGS. 9A to 9C are cross-sectional views showing a process of fabricating a phase shift mask, for explaining a method of fabricating the phase shift masks according to the first and second embodiments of the present invention.
Figure 9B:
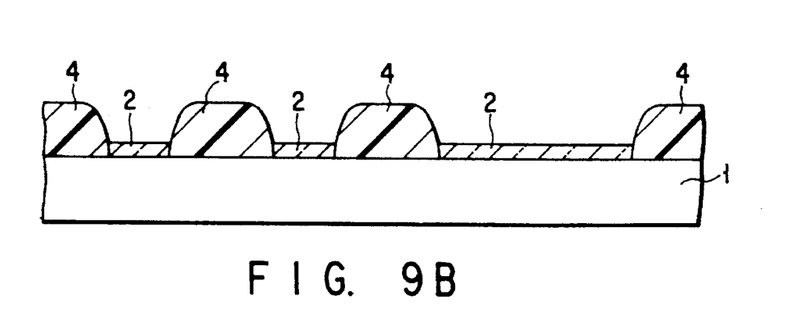
Figure 9C:
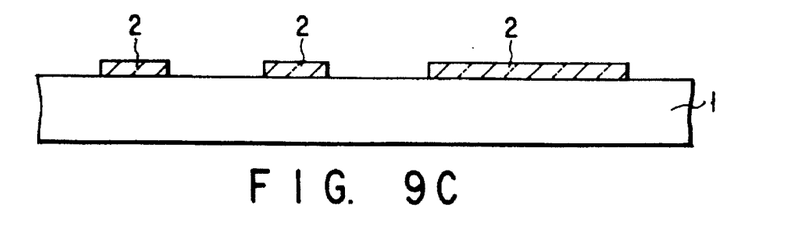

FIGS. 9A to 9C are views for explaining a method of fabricating the phase shift masks according to the above first and second embodiments, and show the major steps thereof in order.

First, as shown in FIG. 9A, resist patterns 4 are formed on a quartz substrate 1. Then the substrate 1 is inserted into a vacuum chamber of a plasma generation device, and carbon tetrafluoride ($CF_4$) gas is introduced into the chamber. High-frequency energy is applied to the substrate to generate fluorine (F) plasma and provide fluorine on the surfaces of the resist patterns 4. Consequently, the surface energy of the patterns 4 is decreased, and an LPD film can be prevented from growing on each resist (photoresist) pattern 4.

Next the quartz substrate 1 is soaked into a silicon oxide supersaturated solution of hydrofluoric acid, and a silicon oxide is precipitated out of the solution, with the result that, as shown in FIG. 9B, LPD films ($SiO_2$ films, i.e., phase shifters) 2 each having a predetermined thickness are formed on that surface of the substrate 1 which are not covered with the patterns 4. It is desirable to properly adjust the thickness of the LPD film in accordance with the wavelength of light used for exposure. For example, when the i-line is used for exposure, the thickness ranges from 0.368 to 0.407 μm, and when the KrF excimer laser is used, it ranges from 0.251 to 0.277 μm.

After that, the quartz substrate 1 is inserted into a resist ashing device (asher) to ash unnecessary resist patterns 4 by oxygen plasma and remove them, as illustrated in FIG. 9C.

According to the above method, a chromeless or halftone phase shift mask can be fabricated by only the phase shifters 2.

FIGS. 10A to 10D are views for explaining a method of fabricating the phase shift masks according to the above third and fourth embodiments, and show the major steps thereof in order.

Figure 10A:
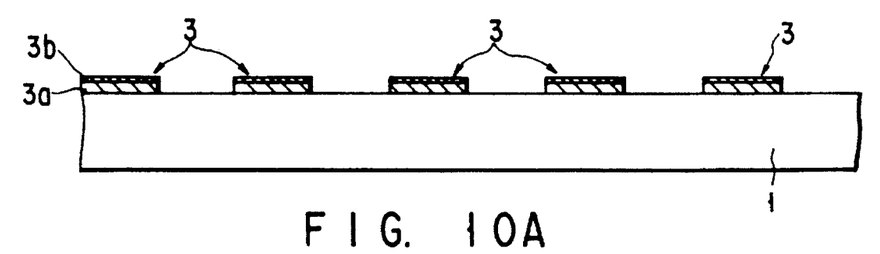
FIGS. 10A to 10D are cross-sectional views showing a process of fabricating a phase shift mask, for explaining a method of fabricating the phase shift masks according to the third and fourth embodiments of the present invention.

First, as illustrated in FIG. 10A, a chrome layer having a thickness of about 1000Å is formed on a quartz substrate 1 by sputtering, and light-shielding film patterns 3 are formed by patterning the chrome layer. The light-shielding film patterns 3 each have a two-layered structure including a chrome layer 3a and a chrome oxide film 3b obtained by oxidizing the surface of the chrome layer 3a.

Figure 10B:
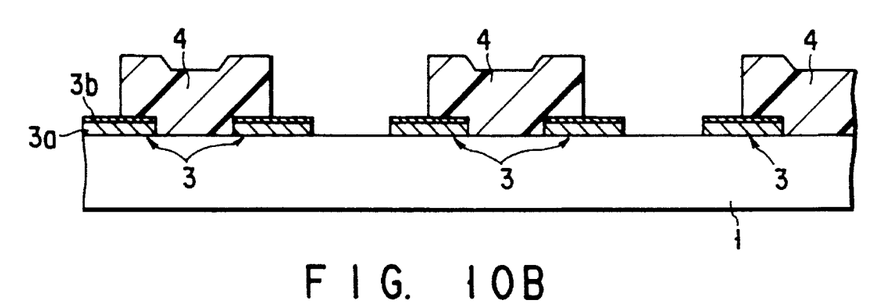

As shown in FIG. 10B, resist patterns 4 are formed on that exposed surface of the substrate 1 which requires no phase shifters. The surfaces of the resist patterns 4 are subjected to plasma treatment by the same method which has been described with reference to FIG. 9A.

Figure 10C:
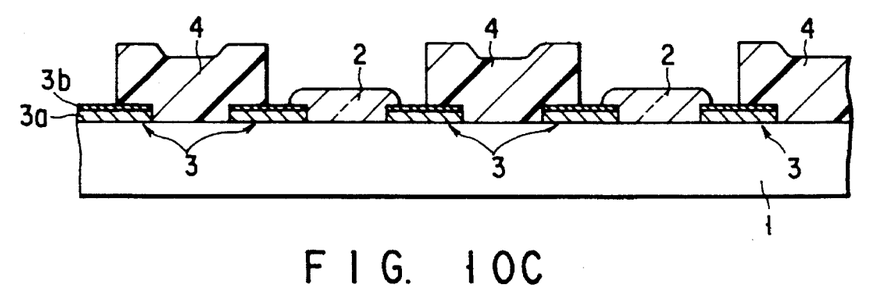
Figure 11:
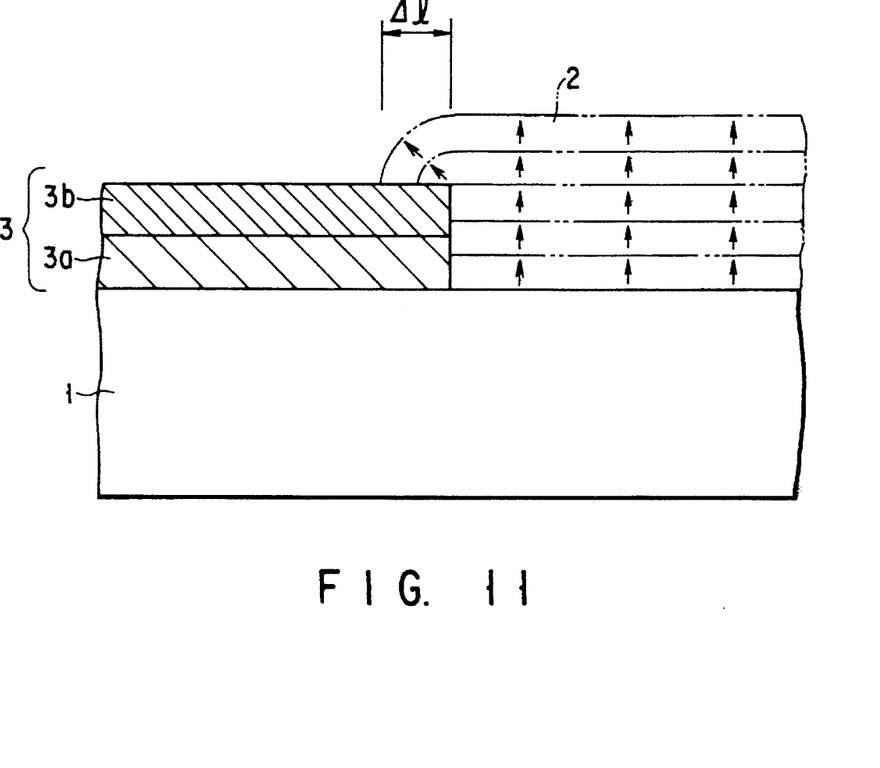
FIG. 11 is a cross-sectional view for explaining the liquid phase growth in the process shown in FIG. 10D.

After that, the quartz substrate 1 is dipped into a silicon oxide supersaturated solution of hydrofluoric acid, and a silicon oxide is precipitated out of the solution, with the result that, as shown in FIG. 10C, $SiO_2$ films (phase shifters) 2 each having a predetermined thickness are formed on that exposed surface of the substrate 1 which are not covered with the patterns 4. The thickness of each of the $SiO_2$ films 2 is set to 0.368 to 0.407 μm when the i-line is used for exposure and 0.251 to 0.277 μm when the KrF excimer laser is used. Since the $SiO_2$ films 2 are formed neither on resist patterns 4 nor on the chrome oxide films 3b, an overhang of each $SiO_2$ film 2 grows at the edge portion of the shielding pattern 3, as shown in FIG. 11, and an amount of the overhang Δl is determined automatically by the thickness of the $SiO_2$ film. This means that the $SiO_2$ films (phase shifters) 2 are self-aligned with the light-shielding film patterns 3. Therefore, a high-precision mask alignment technique is not required for the resist patterns 4, and rough patterning has only to be performed to such an extent that the surface of the substrate where no $SiO_2$ films are prevented from growing, is covered, with the result that the fabrication process can be simplified.

Figure 10D:
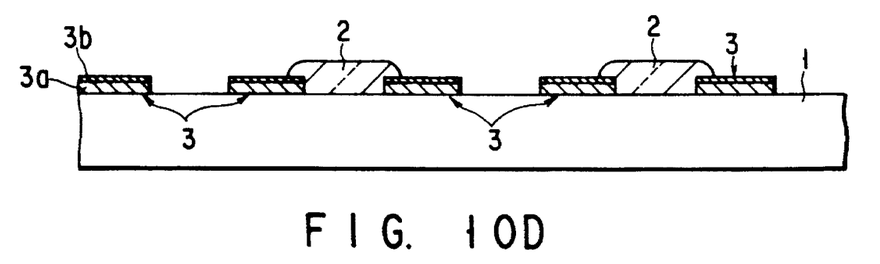

The quartz substrate 1 is inserted into a resist ashing device to ash unnecessary resist patterns 4 by oxygen plasma and remove them, as illustrated in FIG. 10D.

According to the above method shown in FIGS. 10A to 10D, a phase shift mask can be fabricated by combination of phase shifters and light-shielding film patterns.

FIGS. 12A to 12D are views for explaining another method of fabricating the phase shift masks according to the above third and fourth embodiments, and show the major steps thereof in order.

Figure 12A:
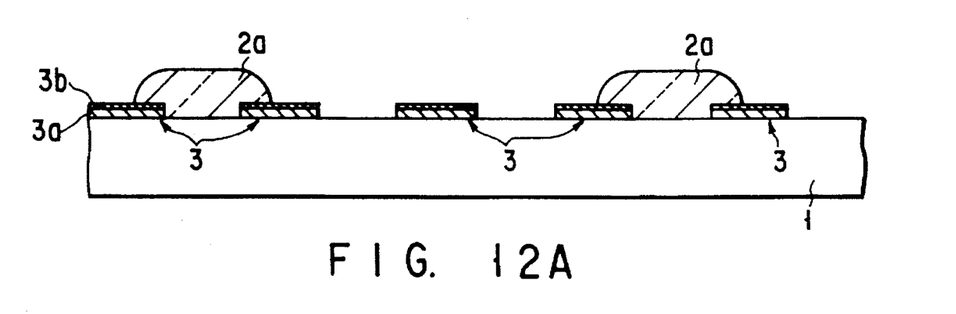
FIGS. 12A to 12D are cross-sectional views showing a process of fabricating a phase shift mask, for explaining another method of fabricating the phase shift masks according to the third and fourth embodiments of the present invention.
Figure 12B:
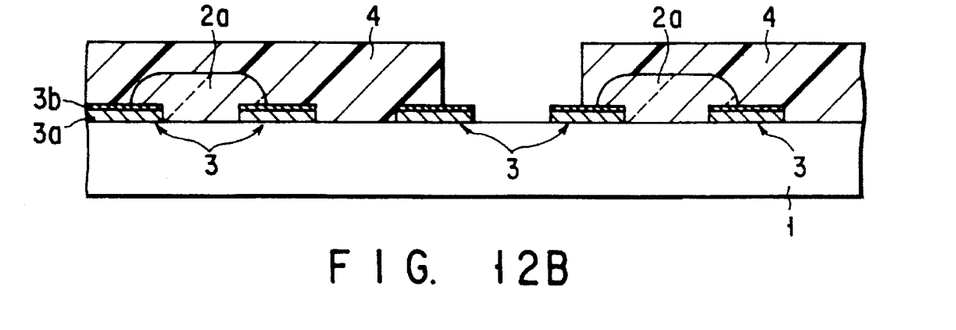

First the structure shown in FIG. 12A is obtained by using the method shown in FIGS. 10A to 10D. FIG. 12A shows phase shifters 2a having a phase difference of 180 degrees, and differs from FIG. 10D in that there are a plurality of exposed portions on the surface of the substrate 1 between the phase shifters, while there is one exposed portion between the phase shifters of the structure shown in FIG. 10D. In the structure of FIG. 12A, the effect of the phase shift can be obtained by setting the phase difference of a portion adjacent to the phase shifters 2a to not 180 degrees but 90 degrees. Therefore, as shown in FIG. 12B, resist patterns 4 are formed such that another phase shifter can be formed at the portion adjacent to the phase shifters 2a.

Figure 12C:
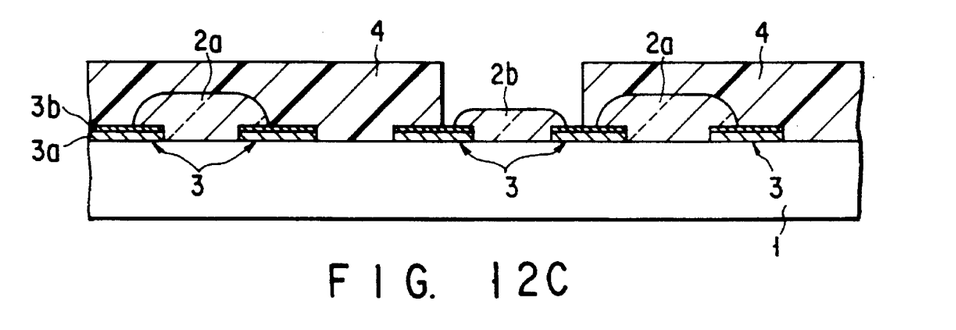

Next a quartz substrate 1 is soaked into a silicon oxide supersaturated solution of hydrofluoric acid, and a silicon oxide is precipitated out of the solution, with the result that a phase shifter 2b having a phase difference of 90 degrees grows on that exposed portion of the substrate 1 which is not covered with the resist patterns. The phase difference is controlled by changing the thickness of the phase shifter 2b to that of the phase shifter 2a.

Figure 12D:
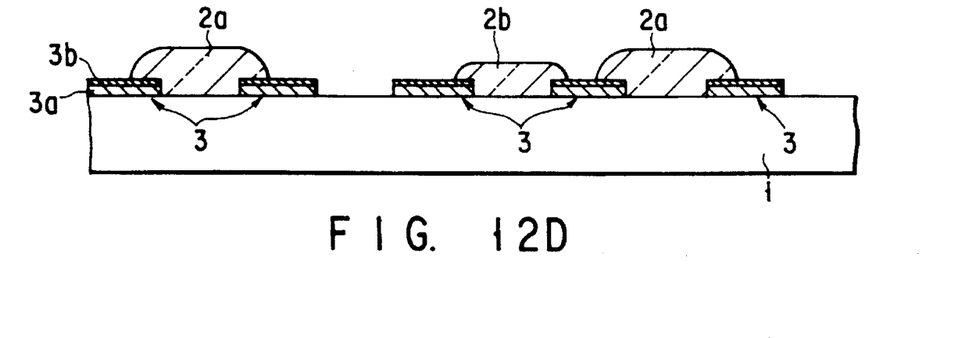

After that, the quartz substrate 1 is inserted into a resist ashing device to ash unnecessary resist patterns 4 by oxygen plasma and remove them, as illustrated in FIG. 12D.

According to the above method shown in FIGS. 12A to 12D, a phase shift mask having resist patterns formed by combination of light-shielding film patterns and phase shifters of different phase differences, can be obtained. This method is effective in fabricating, e.g., a multistage phase shift mask having phase shifters of different phase differences.

FIGS. 13A to 13D are views for explaining a method of fabricating the phase shift mask according to the above fifth embodiment, and show the major steps thereof in order.

Figure 13A:
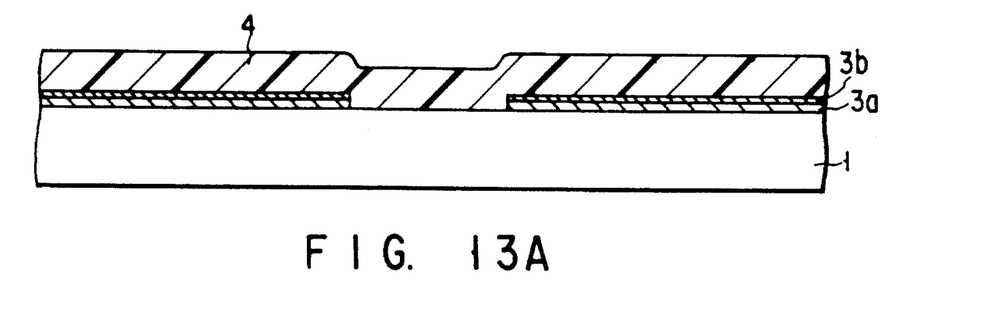
FIGS. 13A to 13D are cross-sectional views showing a process of fabricating a phase shift mask, for explaining a method of fabricating the phase shift mask according to the fifth embodiment of the present invention.

As illustrated in FIG. 13A, a light-shielding film pattern 3 of a two-layered structure including a chrome film 3a and a chrome oxide film 3b formed thereon, is provided on a quartz substrate 1. The thickness of the substrate 1 ranges from 0.09 to 0.125 inch, that of the chrome film 3a is 600Å, and that of the chrome oxide film 3b ranges from 300 to 400Å. Positive photoresist is applied to the surface of the shielding film pattern 3 to form a resist layer 4. In this embodiment, the thickness of the resist layer 4 is about 300 nm and a factor in determining the thickness of a phase shifter layer 2 formed on the resist layer 4.

Figure 13B:
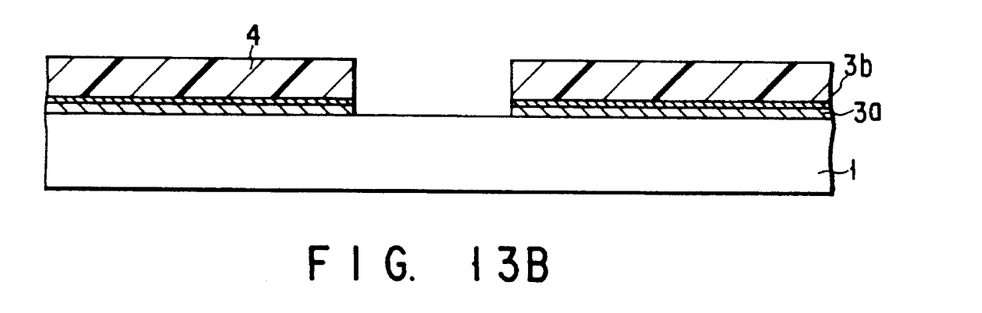

The resist layer 4 is exposed by ultraviolet rays radiating from the undersurface of the quartz substrate 1, using the shielding film pattern 3 as a mask. In this embodiment, the exposure is performed for about ten seconds using a mercury lamp of 300 W. After the exposure, a development operation is carried out by using an alkali developer, with the result that the resist layer 4 remains only on the light-shielding film pattern 3, as shown in FIG. 3B.

Figure 13C:
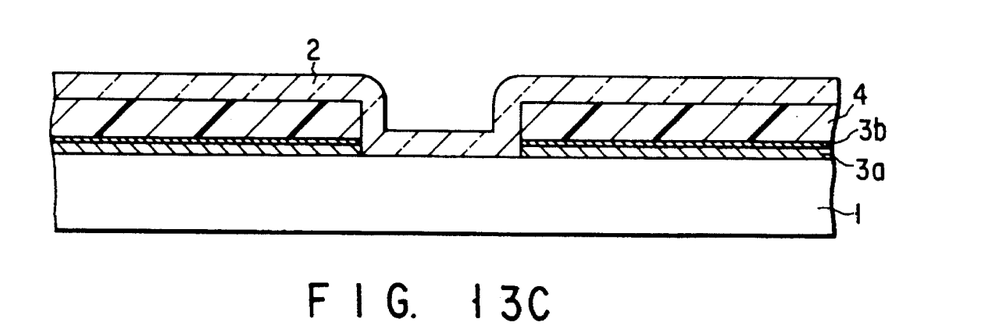

The quartz substrate 1 on which the resist layer is formed, is dipped into a silicofluoric acid ($H_2SiF_6$) solution to lose its balance, thereby precipitating $SiO_2$ (LPD film) out of the solution, and forming an $SiO_2$ film 2 (phase shifter layer) so as to cover the resist layer 4 and the exposed surface of the substrate 1, as shown in FIG. 13C. The silicofluoric acid solution can be generated by stirring $SiO_2$ and dissolving it into hydrofluoric acid having a relatively low temperature of 10° to 15° C. In this embodiment, boric acid or aluminum is added to the solution of 35° C. to lose the balance of the substrate, thus precipitating the $SiO_2$ of 0.08 μm within thirty minutes. Since, in this time, $SiO_2$ is precipitated uniformly even from the surface of the resist layer 4, it is desirable to subject the surface of the layer 4 to plasma treatment or treat the surface of the layer 4 by a surface-active agent or the like for improving in wettability. A silane coupling agent is effectively used as the surface-active agent. The formula of the silane coupling agent is $RSi(OR')_3$, where R and R' are organic substituents. Since $SiO_2$ can be deposited at a temperature almost equal to the room temperature, this method has the advantage that the $SiO_2$ film 2 can easily be formed even on the resist layer 4, without degrading the layer 4.

Figure 13D:
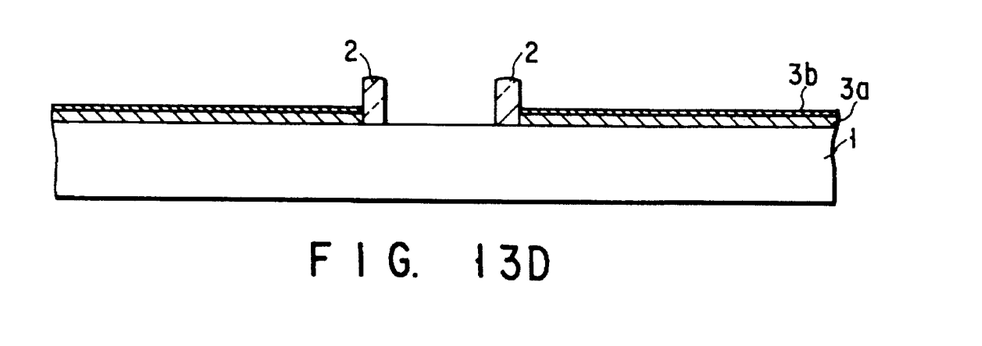

After that, as shown in FIG. 13D, the $SiO_2$ film 2 is etched by the RIE (Reactive Ion Etching). If the etching is executed to such an extent that the $SiO_2$ film 2 formed on the resist layer 4 is removed, the $SiO_2$ can be left on the side walls of the resist layer 4 since the film 2 is thicker on the side walls than on the other part. The quartz substrate 1 is inserted into a resist ashing device to ash the unnecessary resist layer 4 by oxygen plasma and remove it.

According to the method shown in FIGS. 13A to 13D, an edge emphasis phase shift mask can be fabricated.

If the transmittance or refractive index has to be adjusted in the above fabrication methods, pigment such as Cathilon Yellow is added to the silicofluoric acid solution described above. Since this pigment is also included in the formed $SiO_2$ (LPD) film 2, if the thickness of the film 2 is 2000Å, the transmittance of light (wavelength: 365 nm) applied to the film 2 is 9%. The phase shifter ($SiO_2$ film 2) obtained by the above methods can greatly decrease the light intensity at its end portions and is thus effective especially in the halftone phase shift mask in which a small pattern is formed.

Another method of fabricating the phase shift masks according to the first to fifth embodiments of the present invention, will now be described. In this method, when $SiO_2$ for constituting a phase shifter is grown by the LPD, a reaction liquid 5 is caused to flow in the direction of arrow AL shown in FIG. 14.

Figure 14:
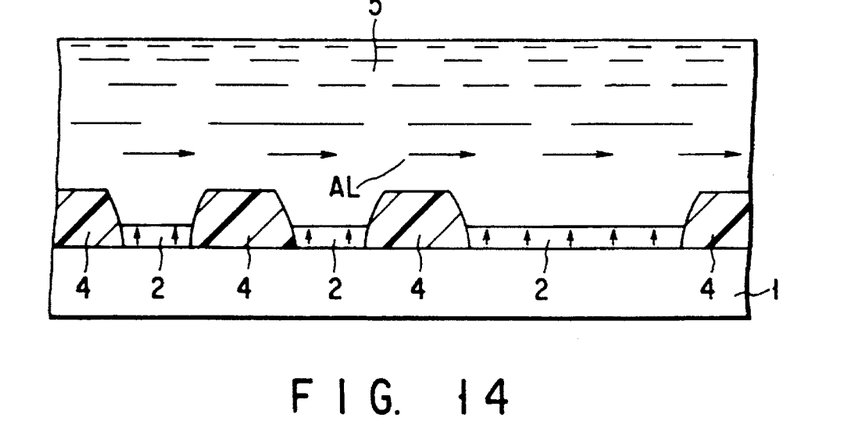
FIG. 14 is a schematic cross-sectional view for explaining another method of fabricating the phase shift masks according to the first to fifth embodiments of the present invention.
Figure 15:
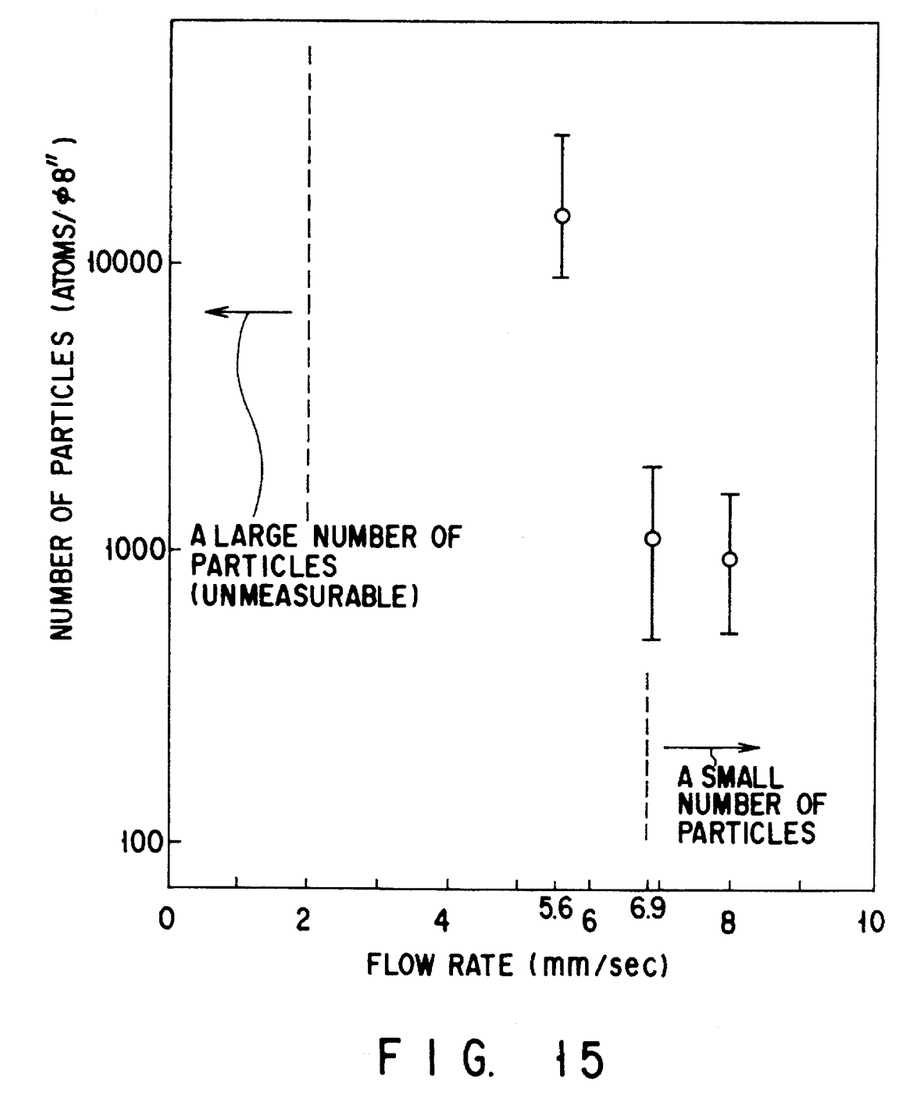
FIG. 15 is a diagram showing a relationship between the flow rate of reaction liquid and the number of particles in the method shown in FIG. 14.

FIG. 15 is a diagram showing a relationship between the flow rate of the reaction liquid and the number of particles attached to the $SiO_2$ film in the method shown in FIG. 14. As is apparent from the diagram, when the flow rate of the reaction liquid ranges from 0 to 2 mm/sec, there are so many particles that they cannot be measured. If, however, the flow rate increases up to, e.g., 5.6 to 6 mm/sec, the number of particles decreases in the order of $10^4$. If the flow rate exceeds 6 mm/sec, the number of particles decreases further. For example, if the flow rate reaches 6.9 mm/sec or more, the number of particles reduces in the order of $10^2$ to $10^3$.

The inventors have already confirmed that the number of particles can greatly be decreased even when the reaction liquid flows at the flow rate of 30 mm/sec which is the limited value of a measurement device. It is thus presumed that a considerably strong effect can be obtained even though the flow rate is increased further.

As described above, the number of particles can be reduced by forming the $SiO_2$ film by the LPD while causing the reaction liquid to flow. The reduction in particles decreases the problems such as scattering of light, and a phase shifter of high quality can be fabricated accordingly.

Still another method of fabricating a phase shift mask according to the first to fifth embodiments of the present invention, will now be described. In this method, $SiO_2$ grows on the transmitting substrate, and then the substrate on which the phase shifters are formed from the $SiO_2$, is annealed. Since the anneal is performed after the phase shifter ($SiO_2$ film) is formed, the thickness, refractive index, and light transmittance of the phase shifter can be controlled.

Figure 16:
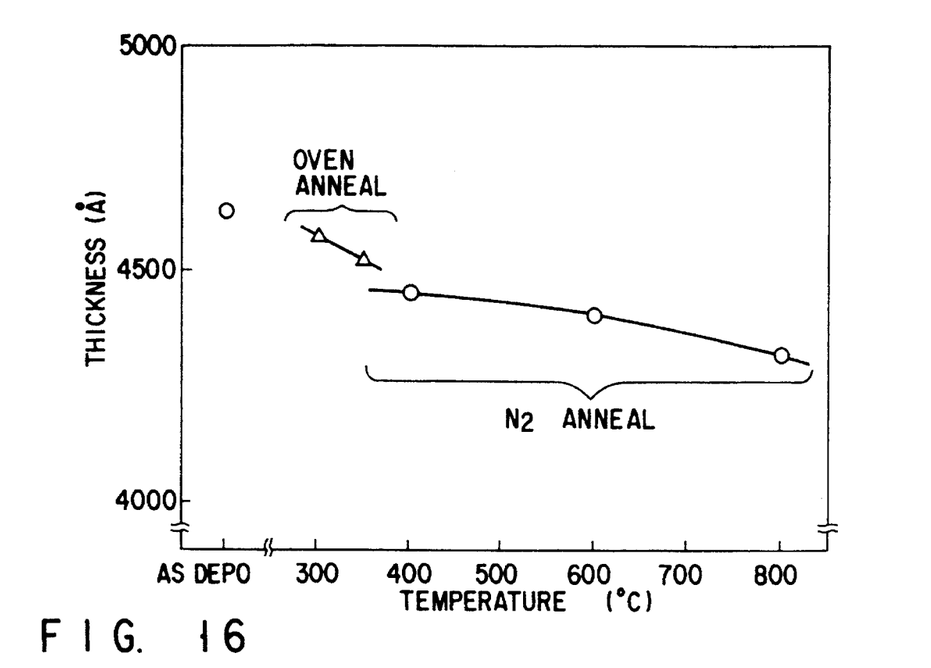
FIG. 16 is a diagram showing a relationship between the temperature of annealing and the thickness of a phase shifter.
Figure 17:
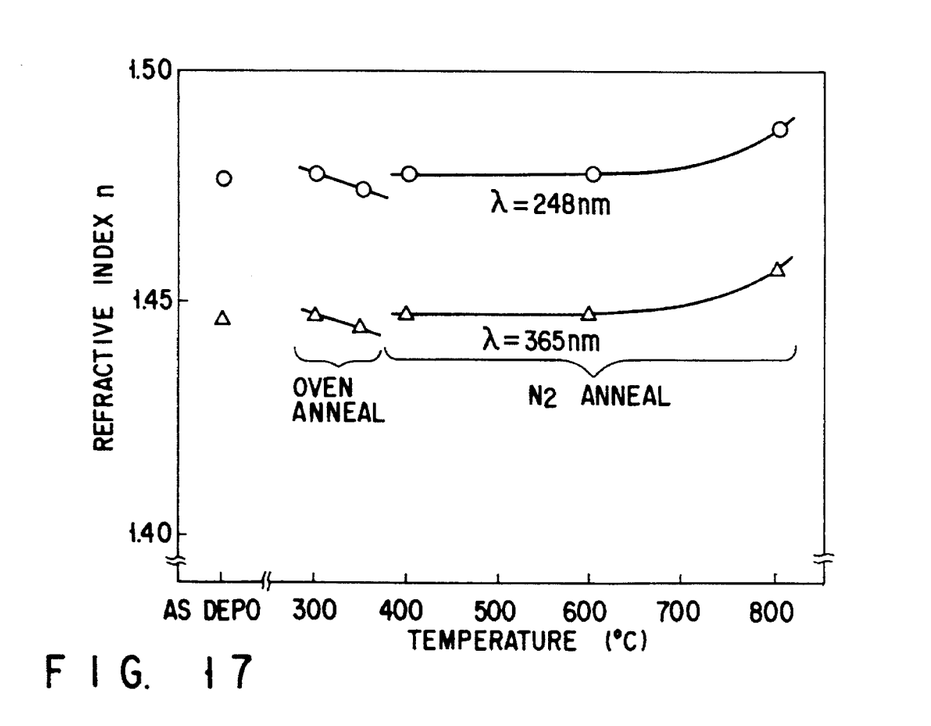
FIG. 17 is a diagram showing a relationship between the temperature of annealing and the refractive index.

FIG. 16 is a diagram showing a relationship between the temperature of the anneal and the thickness of the phase shifter, and FIG. 17 is a diagram showing a relationship between the temperature of the anneal and the refractive index.

As is apparent from FIG. 16, it has been confirmed that the LPD film tends to decrease in thickness. The thinner the LPD film, the higher the anneal temperature. It is thus possible to control the thickness of the phase shifter by annealing the substrate on which the $SiO_2$ film is formed by the LPD.

As is apparent from FIG. 17, it has also been confirmed that the refractive index varies with the anneal. By using this phenomenon, the refractive index can be controlled, too. The optimum thickness d of the phase shifter can be given from the equation, "$d=\lambda/2(n-1)$," where $\lambda$ is wavelength of light for exposure and n is refractive index.

The present invention is not limited to the above embodiments, but various changes and modifications thereto can be made without departing from the scope of the subject matter of the invention. In the foregoing embodiments, the quartz substrate is used as the transmitting substrate. However, it can be replaced with, for example, aluminoboro silicate glass. When the ArF excimer laser (wavelength: 193 nm) is used for exposure, sapphire is considered to be favorable for the transmitting substrate. Furthermore, in the above embodiments, the laminated structure of the chrome layer and chrome oxide film is employed as a light-shielding film pattern. However, it can be constituted of the chrome layer only, or can be constituted of tungsten, molybdenum silicide, tantalum, and the like. Though the five X phase shift mask is given by way of example in the above embodiments, it is needless to say that any other multiple phase shift mask can be applied to the present invention, and the dimensions of a phase shifter can be set in accordance with the rate of reduction.

What is claimed is:

1. A phase shift mask comprising:
   a transmitting substrate;
   light-shielding film patterns formed on said transmitting substrate;
   an antireflection film formed on a surface of each of said light-shielding film patterns; and
   phase shifters formed on at least one exposed surface of said transmitting substrate and formed by an LPD film.

2. The phase shift mask according to claim 1, wherein said transmitting substrate includes a quartz substrate, and said phase shifters each include an LPD $SiO_2$ film.

3. The phase shift mask according to claim 1, wherein said light-shielding film patterns are selected from the group consisting of chrome, tungsten, molybdenum silicide, and tantalum.

4. The phase shift mask according to claim 1, wherein said light-shielding film patterns are arranged at regular pitches on said transmitting substrate, and said phase shifters are arranged alternately on exposed surfaces between said light-shielding film patterns.

5. The phase shift mask according to claim 1, wherein said light-shielding film patterns are arranged at alternate narrow and broad pitches, and said phase shifters are each formed in the narrow pitch between said light-shielding film patterns.

6. A phase shift mask comprising:
   a transmitting substrate;
   light-shielding film patterns formed on said transmitting substrate;
   an antireflection film formed on a surface of each of said light-shielding film patterns; and
   phase shifters formed by an LPD film on an exposed surface of said transmitting substrate and on side walls of said light-shielding film patterns.

7. The phase shift mask according to claim 6, wherein said transmitting substrate includes a quartz substrate, and said phase shifters each include an LPD $SiO_2$ film.

8. The phase shift mask according to claim 6, wherein said light-shielding film patterns are selected from the group consisting of chrome, tungsten, molybdenum silicide, and tantalum.

9. A method of fabricating a phase shift mask, comprising the steps of:
   forming a photoresist pattern on a transmitting substrate;
   forming a phase shifter on an exposed surface of said transmitting substrate by liquid phase deposition so that a reaction liquid flows on said transmitting substrate at a flow rate of at least 6 mm/sec; and
   annealing said phase shifter and controlling at least one of a thickness of said phase shifter and a refractive index of said phase shifter.

10. A method of fabricating a phase shift mask, comprising the steps of:
    forming a photoresist pattern on a transmitting substrate;
    introducing fluorine into a surface of said photoresist pattern;
    forming a phase shifter on an exposed surface of said transmitting substrate by liquid phase deposition so that a reaction liquid flows on said transmitting substrate at a flow rate of at least 6 mm/sec;
    annealing said phase shifter and controlling at least one of a thickness of said phase shifter and a refractive index of said phase shifter; and
    removing said photoresist pattern.

11. The method according to claim 10, wherein said step of introducing the fluorine is executed by generating and introducing fluorine plasma into the surface of said photoresist pattern.

12. The method according to claim 10, wherein said step of forming the phase shifter by the liquid phase deposition is executed by soaking said transmitting substrate into a silicon oxide supersaturated solution of hydrofluoric acid, precipitating a silicon oxide out of the silicon oxide supersaturated solution, and growing $SiO_2$ on an exposed surface of said transmitting substrate.

13. The method according to claim 10, wherein said step of removing the photoresist pattern is executed by ashing the photoresist pattern by oxygen plasma and removing the ashed resist pattern.

14. A method of fabricating a phase shift mask, comprising the steps of:
    forming a light-shielding film pattern on a transmitting substrate;
    forming a photoresist pattern on part of an exposed surface of said transmitting substrate;
    introducing fluorine into a surface of said photoresist pattern;
    forming a phase shifter on an exposed surface of said transmitting substrate by liquid phase deposition so that a reaction liquid flows on said transmitting substrate at a flow rate of at least 6 mm/sec;
    annealing said phase shifter and controlling at least one of a thickness of said phase shifter and a refractive index of said phase shifter; and
    removing said photoresist pattern.

15. The method according to claim 14, wherein said step of forming said light-shielding film pattern includes a step of forming a light-shielding film on said transmitting substrate, and a step of forming an antireflection film on said light-shielding film.

16. The method according to claim 14, wherein said step of introducing the fluorine is executed by generating and introducing fluorine plasma into the surface of said photoresist pattern.

17. The method according to claim 14, wherein said step of forming the phase shifter by the liquid phase deposition is executed by soaking said transmitting substrate into a silicon oxide supersaturated solution of hydrofluoric acid, precipitating a silicon oxide out of the silicon oxide supersaturated solution, and growing SiO$_2$ on an exposed surface of said transmitting substrate.

18. The method according to claim 14, wherein said step of removing the photoresist pattern is executed by ashing the photoresist pattern by oxygen plasma and removing the ashed photoresist pattern.

19. A method of fabricating a phase shift mask, comprising the steps of:

forming a light-shielding film pattern on a transmitting substrate;

forming a first photoresist pattern on part of an exposed surface of said transmitting substrate;

forming a first phase shifter on an exposed surface of said transmitting substrate by liquid phase deposition so that a reaction liquid flows on said transmitting substrate at a flow rate of at least 6 mm/sec;

removing said first photoresist pattern;

forming a second photoresist pattern on a surface other than the exposed surface of said transmitting substrate, said exposed surface being adjacent to said first shifter;

forming a second phase shifter, having a different thickness from that of the first phase shifter, on the exposed surface of said transmitting substrate by liquid phase deposition so that a reaction liquid flows on said transmitting substrate at a flow rate of at least 6 mm/sec;

annealing said first phase shifter and said second phase shifter and controlling at least one of the thicknesses of said first phase shifter and second phase shifter and a refractive index of said second phase shifter; and removing said second photoresist pattern.

20. The method according to claim 19, wherein said step of forming said light-shielding film pattern includes a step of forming a light-shielding film on said transmitting substrate, and a step of forming an antireflection film on said light-shielding film.

21. The method according to claim 19, further comprising a step of introducing fluorine into a surface of said first photoresist pattern after said step of forming said first photoresist pattern.

22. The method according to claim 21, wherein said step of introducing the fluorine into the surface of said first photoresist pattern is executed by generating and introducing fluorine plasma into the surface of said first photoresist pattern.

23. The method according to claim 19, further comprising a step of introducing fluorine into a surface of said second photoresist pattern after said step of forming said second photoresist pattern.

24. The method according to claim 23, wherein said step of introducing the fluorine into the surface of said second photoresist pattern is executed by generating and introducing fluorine plasma into the surface of said second photoresist pattern.

25. The method according to claim 19, wherein said step of forming the first phase shifter by the liquid phase deposition is executed by soaking said transmitting substrate into a silicon oxide supersaturated solution of hydrofluoric acid, precipitating a silicon oxide out of the silicon oxide supersaturated solution, and growing SiO$_2$ on an exposed surface of said transmitting substrate, and said step of forming the second phase shifter by the liquid phase deposition is executed by soaking said transmitting substrate into a silicon oxide supersaturated solution of hydrofluoric acid, precipitating a silicon oxide out of the silicon oxide supersaturated solution, and growing SiO$_2$ on an exposed surface of said transmitting substrate.

26. The method according to claim 19, wherein said step of removing the first photoresist pattern is executed by ashing the first photoresist pattern by oxygen plasma and removing the ashed first photoresist pattern, and said step of removing the second photoresist pattern is executed by ashing the second photoresist pattern by oxygen plasma and removing the ashed second photoresist pattern.

27. A method of fabricating a phase shift mask, comprising the steps of:

forming a light-shielding film pattern on a transmitting substrate;

forming a positive photoresist layer on said light-shielding film pattern and said transmitting substrate;

exposing said photoresist layer by irradiating an undersurface of said transmitting substrate with light, using said light-shielding film pattern as a mask;

forming a transmitting film on said photoresist layer and said transmitting substrate by liquid phase deposition so that a reaction liquid flows on said transmitting substrate at a flow rate of at least 6 mm/sec;

forming a phase shifter on side walls of said photoresist layer by removing said transmitting film by anisotropic etching;

annealing said phase shifter and controlling at least one of a thickness of said phase shifter and a refractive index of said phase shifter; and removing said photoresist pattern.

28. The method according to claim 27, wherein said step of forming the transmitting film by the liquid phase deposition is executed by soaking said transmitting substrate into a silicon oxide supersaturated solution of hydrofluoric acid, precipitating a silicon oxide out of the silicon oxide supersaturated solution, and growing SiO$_2$ on said photoresist layer and said transmitting substrate.

29. The method according to claim 28, further comprising a step of adding pigment into the silicon oxide supersaturated solution of hydrofluoric acid.

30. The method according to claim 27, wherein said step of removing the photoresist layer is executed by ashing the photoresist layer by oxygen plasma and removing the ashed photoresist layer.

31. The method according to claim 27, further comprising a step of treating a surface of said photoresist layer by a surface-active agent.

32. A method of fabricating a phase shift mask, comprising the steps of:

forming a photoresist pattern on a transmitting substrate; and forming a phase shifter on an exposed surface of said transmitting surface by liquid phase deposition so that a reaction liquid flows on said transmitting substrate at a flow rate of at least 6 mm/sec.

33. A method of fabricating a phase shift mask, comprising the steps of:

forming a photoresist pattern on a transmitting substrate;

forming a phase shifter on an exposed surface of said transmitting surface by liquid phase deposition; and annealing said phase shifter and controlling at least one of a thickness of said phase shifter and a refractive index of said phase shifter.

* * * * *